(12) United States Patent
Kawaguchi et al.

(10) Patent No.: US 6,979,845 B2
(45) Date of Patent: Dec. 27, 2005

(54) SEMICONDUCTOR DEVICE IN WHICH PUNCHTHROUGH IS PREVENTED

(75) Inventors: Hiroshi Kawaguchi, Kanagawa (JP); Riki Mizuno, Kanagawa (JP)

(73) Assignee: NEC Electronics Corporation, (JP)

( * ) Notice: Subject to any disclaimer, the term of this patent is extended or adjusted under 35 U.S.C. 154(b) by 0 days.

(21) Appl. No.: 10/763,551

(22) Filed: Jan. 23, 2004

(65) Prior Publication Data

US 2004/0155313 A1   Aug. 12, 2004

(30) Foreign Application Priority Data

Jan. 30, 2003  (JP)  .............................. 2003-022766

(51) Int. Cl.[7] .............................................. H01L 29/73
(52) U.S. Cl. ...................................... 257/273; 257/565
(58) Field of Search ............................... 257/273, 370, 257/378, 565

(56) References Cited

U.S. PATENT DOCUMENTS

| | | | | |
|---|---|---|---|---|
| 3,582,725 A | * | 6/1971 | Matukura et al. ............ | 257/549 |
| 4,126,899 A | * | 11/1978 | Lohstroh et al. ............. | 365/120 |
| 4,320,409 A | | 3/1982 | Shoji ........................... | 357/42 |
| 5,286,991 A | * | 2/1994 | Hui et al. ..................... | 257/306 |
| 5,536,665 A | | 7/1996 | Komori et al. ............... | 437/26 |
| 5,716,887 A | * | 2/1998 | Kim ............................. | 438/309 |
| 5,828,110 A | | 10/1998 | Wollesen ..................... | 257/373 |
| 6,033,946 A | * | 3/2000 | Hutter et al. ................ | 438/202 |

FOREIGN PATENT DOCUMENTS

| | | | | |
|---|---|---|---|---|
| JP | 02-148852 | 6/1990 | ......... | H01L 21/336 |
| JP | 05-267606 | 10/1993 | ........... | H01L 27/10 |
| JP | 06-005867 | 1/1994 | ......... | H01L 29/784 |
| JP | 2002-289704 | 10/2002 | ....... | H01L 21/8247 |

* cited by examiner

Primary Examiner—Allan R. Wilson
(74) Attorney, Agent, or Firm—Hayes Soloway P.C.

(57) ABSTRACT

A semiconductor device includes a semiconductor region of a first conductive type. First and second regions of a second conductive type opposite to the first conductive type are provided in a surface of the semiconductor region in a predetermined interval. A third region of the first conductive type is provided between the first and second regions in the surface of the semiconductor region. A fourth region of the first conductive type is provided below the third region inside the semiconductor region to cover the whole of bottom of the third region at least.

11 Claims, 10 Drawing Sheets

SEMICONDUCTOR DEVICE IN WHICH PUNCHTHROUGH IS PREVENTED

BACKGROUND OF THE INVENTION

1. Technical Field

The present invention is relates to a semiconductor device, and more particularly to a semiconductor device in which a device margin is reduced in an input/output protection section.

2. Description of the Related Art

Recently, the operation frequency of a semiconductor integrated circuit device has become very high. A wiring line region allocated for power supply wiring lines and ground wiring lines tends to have a greater increase in operation frequency. Therefore, it becomes easy for an internal circuit of the semiconductor integrated circuit device to be destroyed if a voltage surge is momentary applied or a high voltage is consistently applied when the semiconductor integrated circuit device is actually used. In order to avoid the destruction of the inner circuit due to application of the voltage or the high voltage, a protection circuit is conventionally connected with input/output terminals to improve the voltage endurance of the internal circuit. As one of such techniques, Japanese Laid Open Patent Application (JP-P2002-289704A) describes a technique, in which boron regions of different depths are formed as P-wells between two N-wells provided in a P-type substrate apart from each other. These regions are formed through two ion implantations using a same mask. The deeper boron region is deeper than the two N-wells to increase the breakdown voltage and to suppress leak between the two N-wells at the same time.

However, when the interval between the two N-wells is of order of submicron, it is not possible to keep the breakdown voltage between the two N-wells high in the P-well structure of the above Japanese Laid Open Patent Application (JP-P2002-289704A).

In conjunction with the above description, a semiconductor device is disclosed in Japanese Laid Open Patent Application (JP-A-Heisei 5-267606). In the semiconductor device of this conventional example, a semiconductor substrate of a first conductive type is provided. An embedded layer of a second conductive type opposite to the first conductive type is formed inside the semiconductor substrate over the whole of the semiconductor substrate. A first well of the first conductive type extends from the semiconductor substrate surface into the inside. A wall region of the second conductive type is formed to surround the peripheral of the first well from the embedded layer to the semiconductor substrate surface. A second well of the first conductive type extends from the semiconductor substrate surface into the inside. A third well of the second conductive type extends from the semiconductor substrate surface into the inside, and is contact with the embedded layer.

Also, a semiconductor device is disclosed in Japanese Laid Open Patent Application (JP-A-Heisei 6-5867). The semiconductor device of this conventional example is a power MOS transistor formed on a semiconductor substrate of a first conductive type. At lease two well diffusion layers of a second conductive type are provided for the semiconductor substrate to have a predetermined interval. A source region of the first conductive type is formed in the well diffusion layer, and a portion of the semiconductor substrate other than said well diffusion layers is formed as a drain region. A portion of the semiconductor substrate between the two well diffusion layers is of the first conductive type and impurity is doped in a higher concentration in a shallower portion of the semiconductor substrate. A cross section in a horizontal direction becomes larger in a depth direction.

Also, a semiconductor device is disclosed in Japanese Laid Open Patent Application (JP-A-Heisei 2-148852). In the semiconductor device of this conventional example, a gate electrode is partially provided on a semiconductor substrate directly or via a gate insulating film. A drain region and a source region are provided on the gate electrode in the semiconductor substrate surface. An insulating film is provided in a wall region of the drain region other than a lower region below the drain region and a channel region below the gate electrode. An impurity dope region is provided at a predetermined depth straight below the gate electrode. This impurity dope region has the same conductive type as the semiconductor substrate and an impurity concentration higher than that of the semiconductor substrate. The peak impurity concentration position of the impurity dope region is within 0.8 $\mu$m from the semiconductor substrate surface.

SUMMARY OF THE INVENTION

An object of the present invention is to provide a semiconductor device, in which it is possible to keep a breakdown voltage between two well regions of a same conductive type high even if the interval between the two well regions is in order of submicrons.

In an aspect of the present invention, a semiconductor device includes a semiconductor region of a first conductive type. First and second regions of a second conductive type opposite to the first conductive type are provided in a surface of the semiconductor region in a predetermined interval. A third region of the first conductive type is provided between the first and second regions in the surface of the semiconductor region. A fourth region of the first conductive type is provided below the third region inside the semiconductor region to cover the whole of bottom of the third region at least.

Here, it is desirable that the fourth region is provided below the first to third regions inside the semiconductor region to cover the whole bottoms of the first to third regions.

In this case, a position of an impurity peak concentration of the fourth region into a depth direction is desirably deeper than a peak position of an impurity concentration in each of the first and second regions into the depth direction. More specifically, the position of the impurity peak concentration in the fourth region into the depth direction is desirably deeper in a range of 0.3 to 0.8 $\mu$m than that of the impurity peak concentration in each of the first and second regions.

Also, a minimum of the impurity peak concentration of the fourth region is $(1-s)*1.4E16$ (atom/cm$^3$), where the predetermined interval is s.

Also, the impurity peak concentration of the fourth region becomes higher as the predetermined interval becomes narrower.

Also, the fourth region may be formed by an ion implantation method or by an epitaxial growth method.

DESCRIPTION OF THE PREFERRED EMBODIMENTS

Hereinafter, a semiconductor device of the present invention will be described with reference to the attached drawings.

Figure 1:
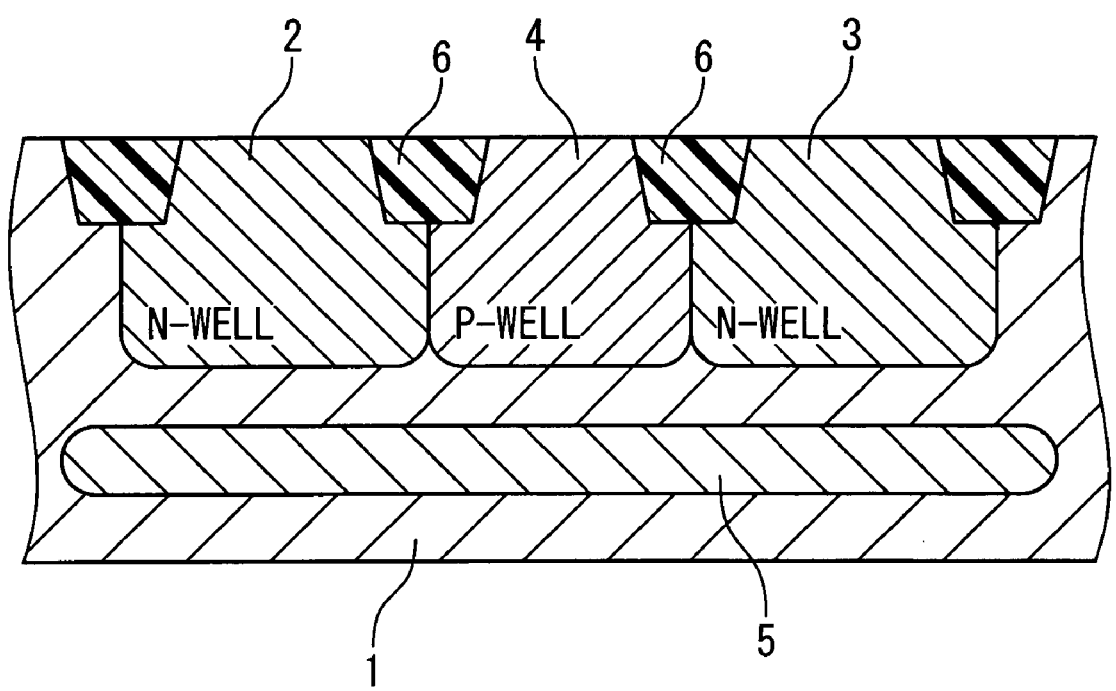
FIG. 1 is a schematic cross sectional view showing a semiconductor device of a first embodiment of the present invention.

FIG. 1 is a schematic cross sectional view showing the semiconductor device according to the first embodiment of the present invention. In the following description, a P-type semiconductor substrate is used as a semiconductor substrate, two N-wells are provided for the P-type semiconductor substrate and a P-well is provided between them. Also, in the following description, a depletion layer which extends from one of the two N-wells to which a high voltage is applied into the inside of the P-type semiconductor substrate will be described. Therefore, the structure of the surface neighborhood of the P-type semiconductor substrate and the structure on it are omitted in FIG. 1.

As shown in FIG. 1, two N-wells 2 and 3 are first provided for a P-type semiconductor substrate 1, and a P-well 4 is formed between them. A P-well 5 or a P-type epitaxial layer is provided below the two N-wells 2 and 3 and the P-well 4. Trench separation insulating films 6 are provided between the two N-wells 2 and 3 and the P-well 4, and in addition to them, trench separation insulating films 6 are provided in neighborhood with the N-wells 2 and 3 on the opposite side to the P-well 4.

Figure 2:
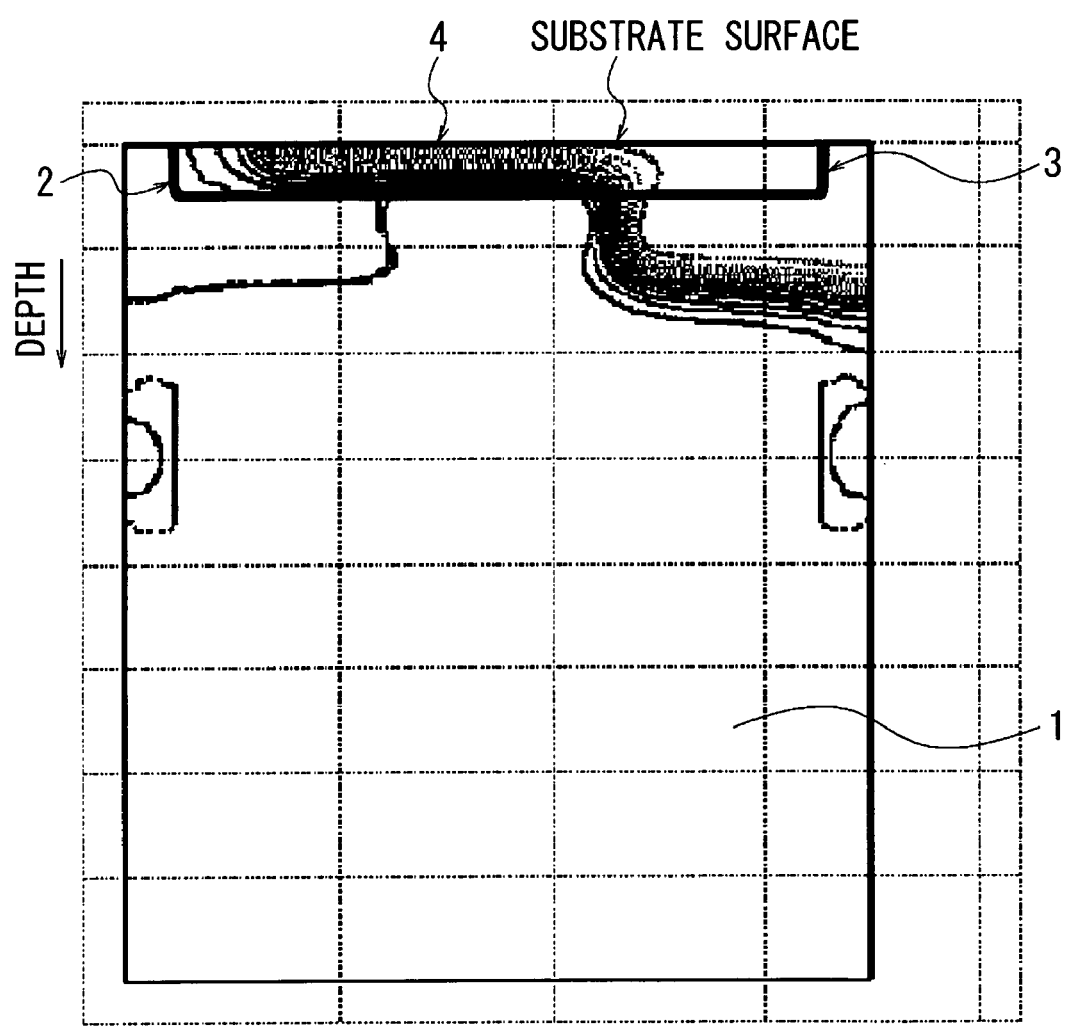
FIG. 2 is a diagram showing a potential distribution when a voltage is applied to one of the two N-wells in the semiconductor device of the first embodiment of the present invention.
Figure 3:
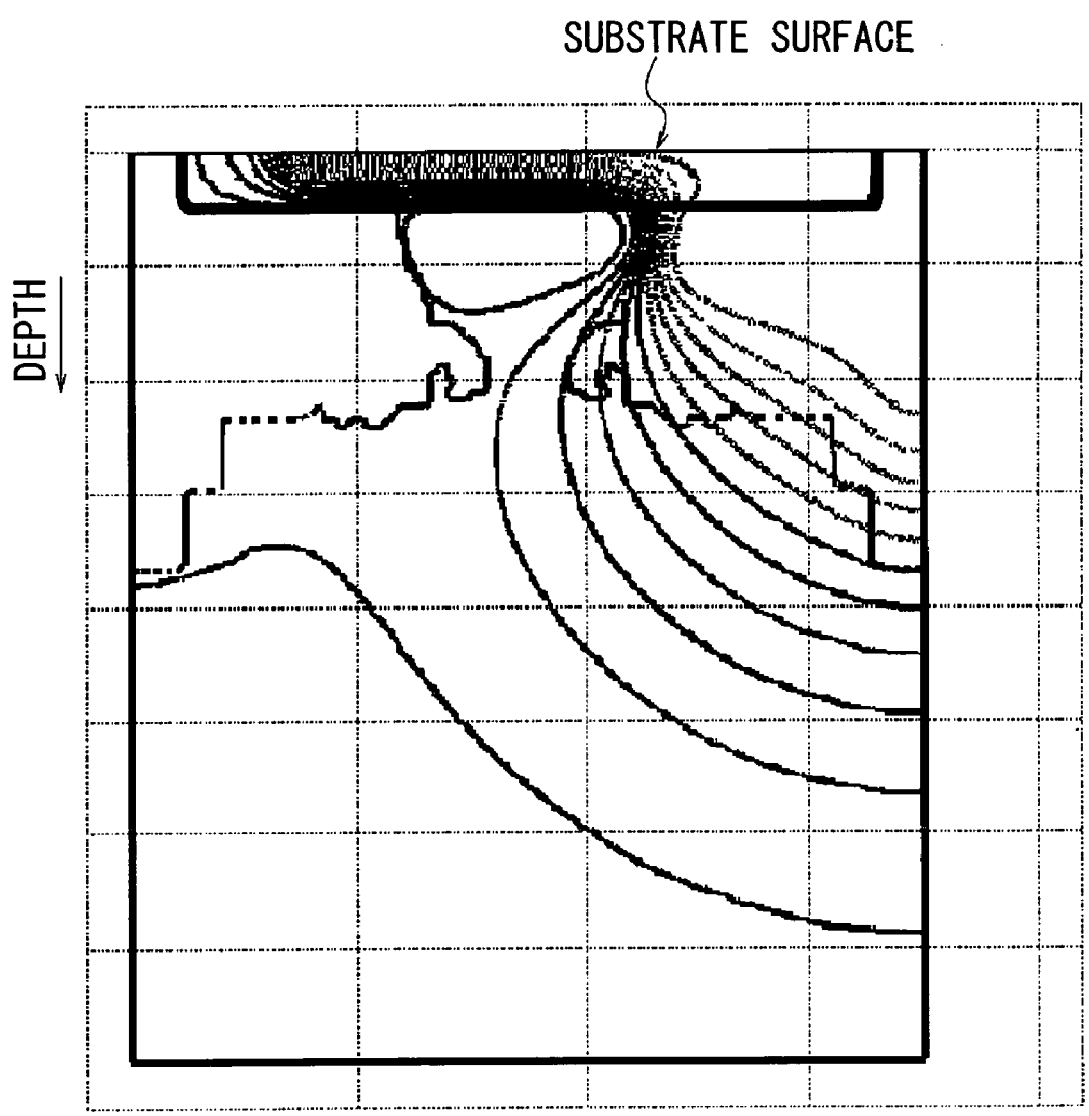
FIG. 3 is a diagram showing a potential distribution when a voltage is applied to one of the two N-wells when an embedded P-well is removed from the semiconductor device of the first embodiment of the present invention.

FIG. 2 shows a potential distribution when the P-type semiconductor substrate 1, the N-well 2 and the P-well 4 are grounded and the voltage of 10 V is applied to the N-well 3 in the above structure. FIG. 3 is a potential distribution when the P-well 5 is not provided in the section structure of FIG. 1. Comparing FIG. 2 and FIG. 3, it could be found that the potential distribution of FIG. 2 is put back within a predetermined depth but the potential distribution of FIG. 3 extends into a down direction and side directions. Thus, it could be understood that the depletion layer from the N-well 3 is put back within the predetermined depth while punchthrough can be prevented in the structure of FIG. 2.

Figure 4:
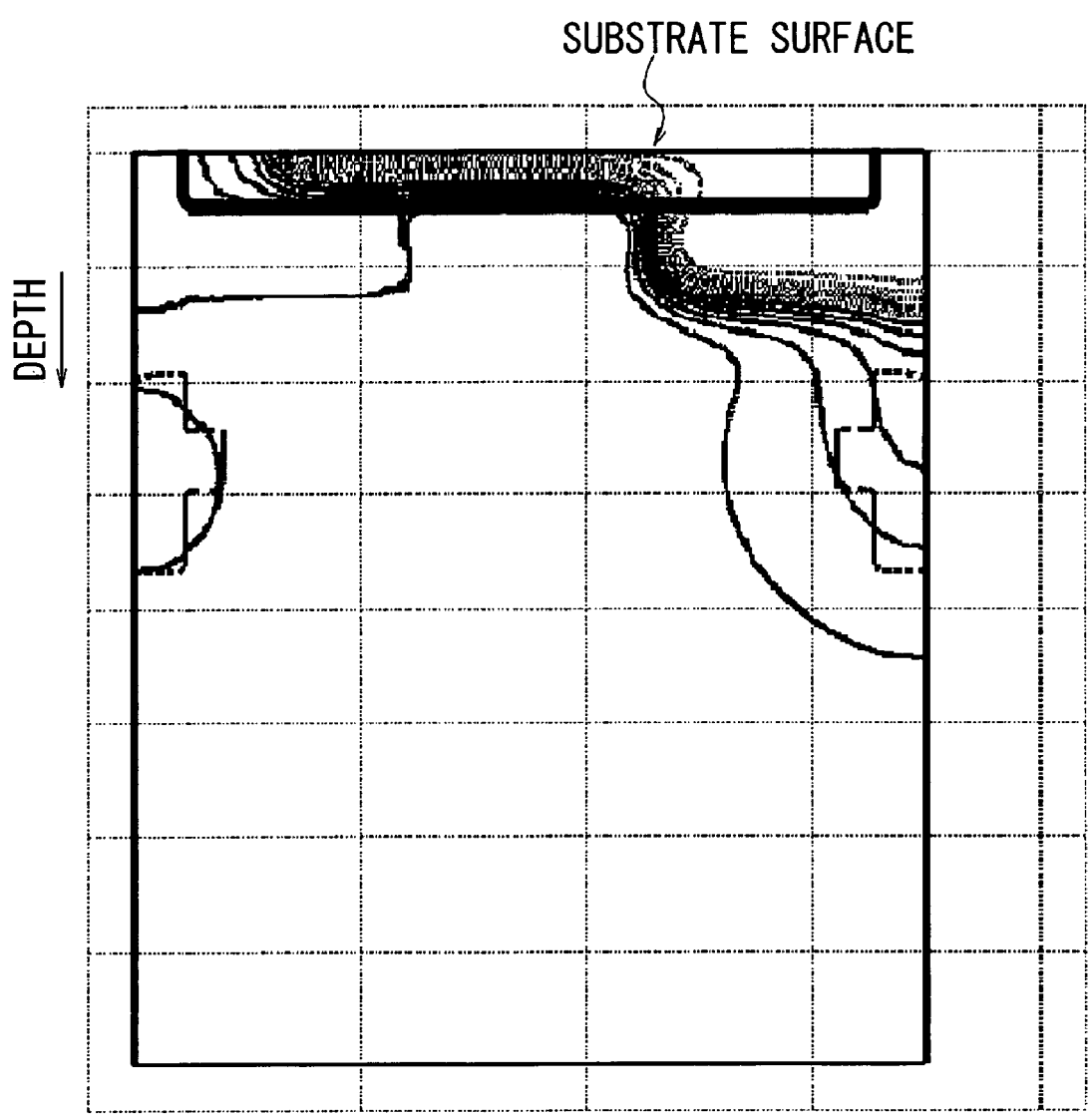
FIG. 4 is a diagram showing a potential distribution when a voltage is applied to one of the two N-wells when a dose quantity of boron is fixed to $5E12/cm^2$ and an ion implantation energy of boron is 300 keV.
Figure 5:
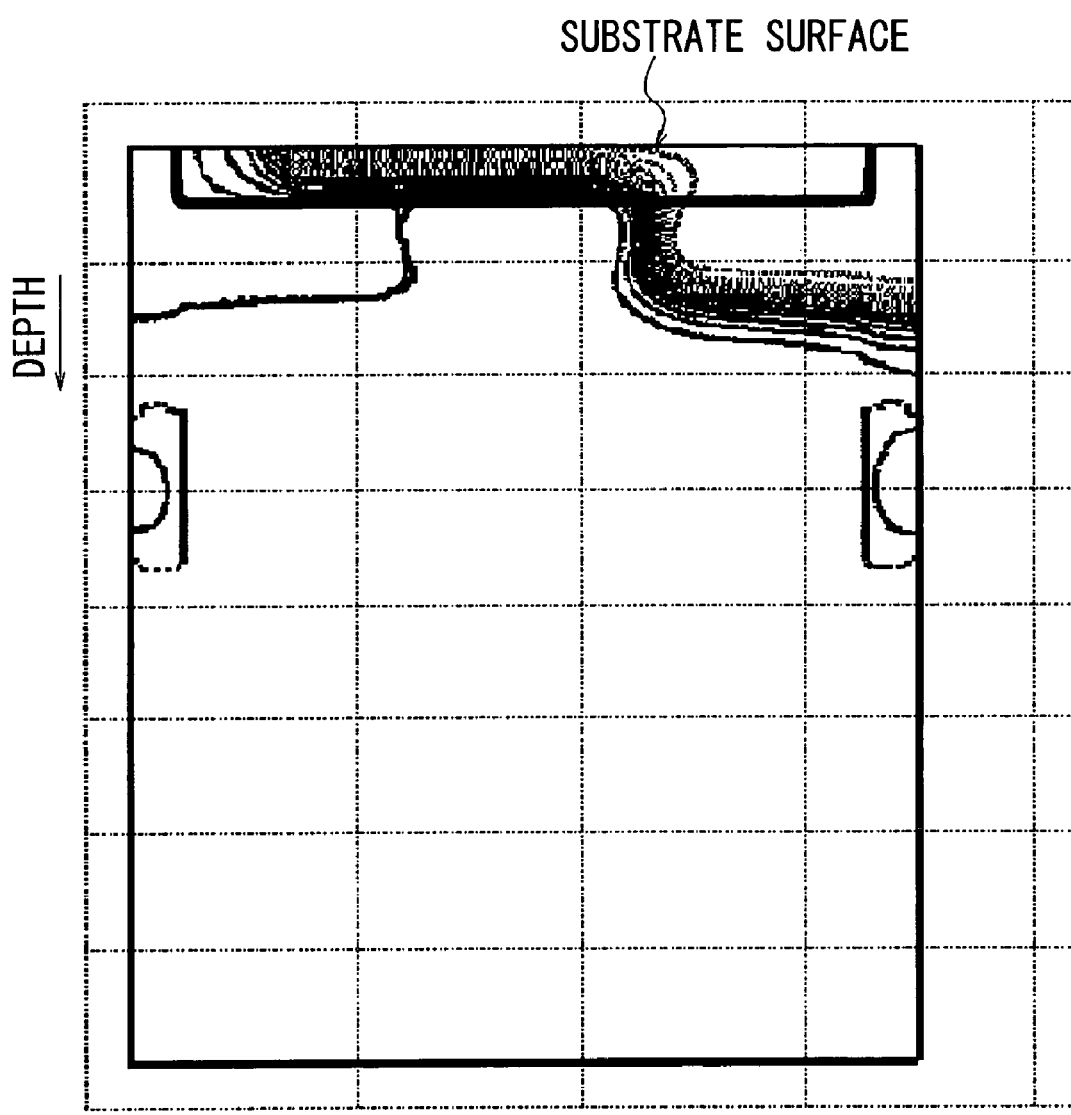
FIG. 5 is a diagram showing a potential distribution when a voltage is applied to one of the two N-wells when a dose quantity of boron is fixed to $5E12/cm^2$ and an ion implantation energy of boron is 360 keV.
Figure 6:
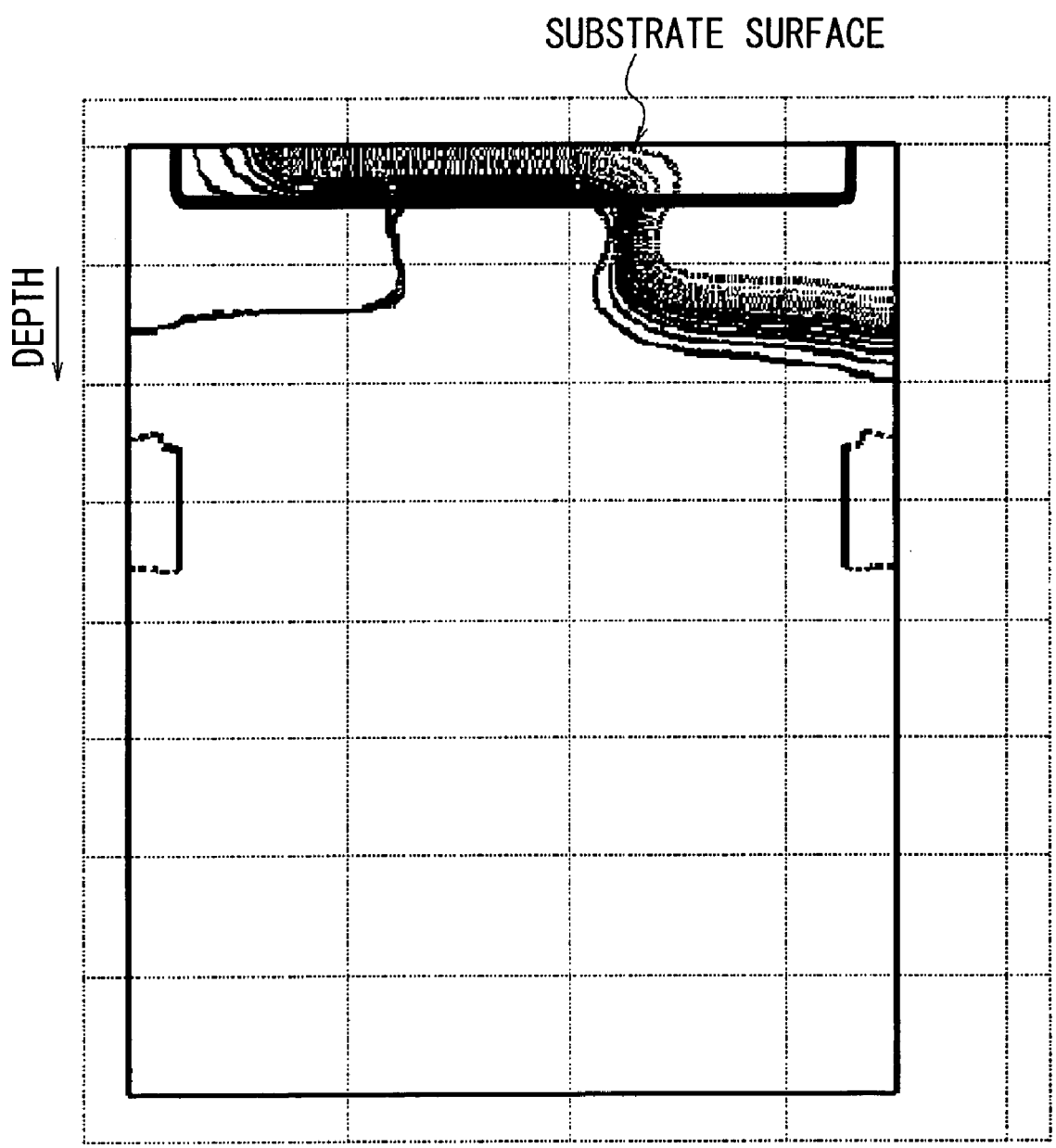
FIG. 6 is a diagram showing a potential distribution when a voltage is applied to one of the two N-wells when a dose quantity of boron is fixed to $5E12/Cm^2$ and an ion implantation energy of boron is 400 keV.

Next, the structure of the P-well 4 will be described. FIGS. 4 to 6 show potential distributions when a dose quantity of boron is fixed to $5E12/cm^2$ and an ion implantation energy of boron is changed in the range of 300 to 400 keV. The bias condition is the same as the above-mentioned condition.

FIG. 4 is the potential distribution when the ion implantation energy of boron is 300 keV. It could be found that a depletion layer extends downwardly from the N-well 3. It could be considered that because the implantation depth of boron is shallow, the boron is compensated by N-type impurities in the N-well 3 in the lateral direction.

FIG. 5 is the potential distribution when the ion implantation energy of boron is 360 keV. It could be found that the extension of the depletion layer from the N-well 3 is suppressed.

FIG. 6 is the potential distribution when the ion implantation energy of boron is 400 keV. It could be found that the extension of the depletion layer from the N-well 3 is more suppressed.

When the ion implantation energy of boron is 300 keV as shown in FIG. 4, there is no case where the depletion layer extends from the N-well 3 to the N-well 2 to cause a punchthrough. From the above, it is sufficient that the boron ion implantation energy is 300 keV at minimum, to prevent the punchthrough fully.

Figure 7:
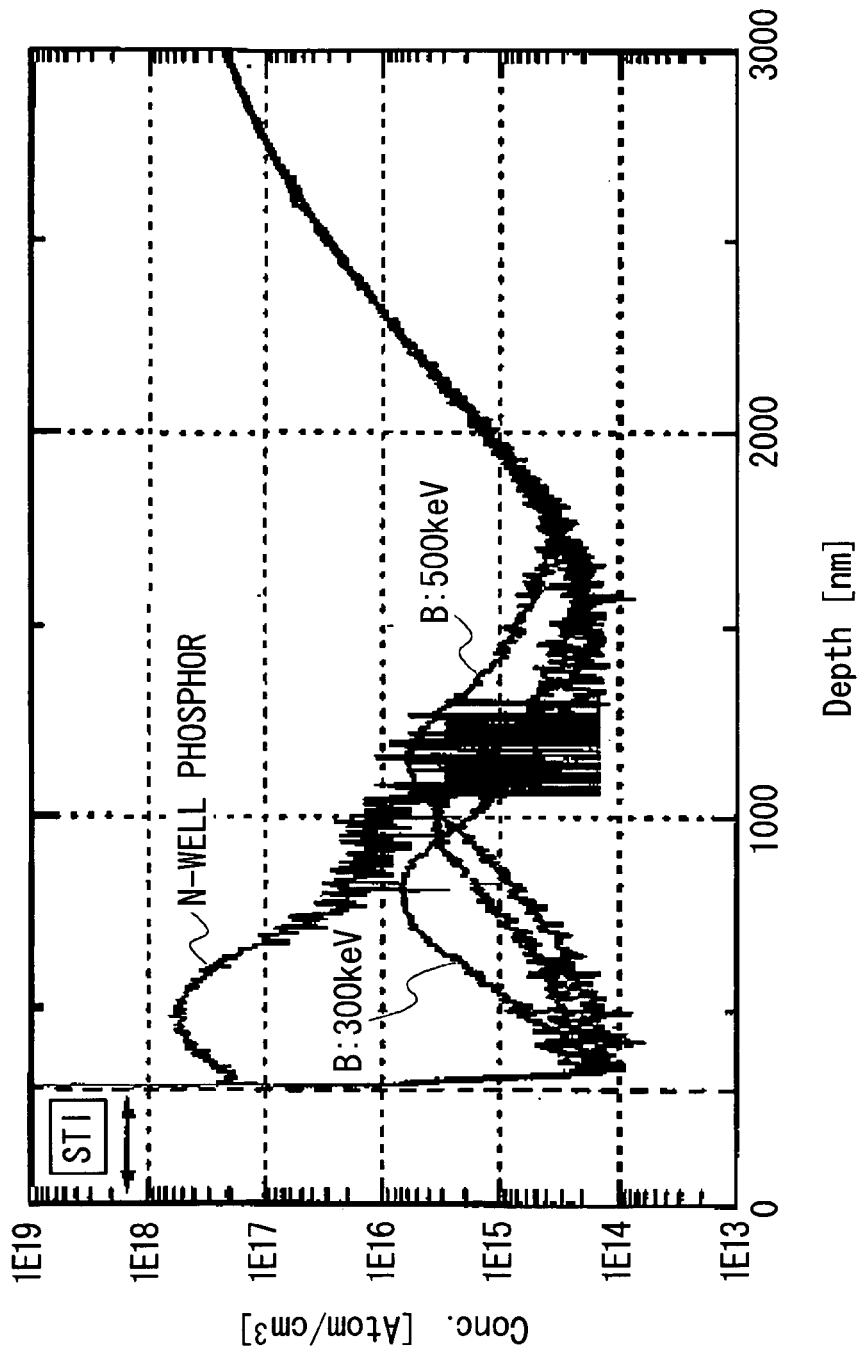
FIG. 7 is an impurity distribution of boron when an ion implantation energy of boron is mainly changed and an impurity distribution of the N-well when a dose quantity of phosphor is $2E13/cm^2$ and an ion implantation energy is 360 keV for forming the N-wells 2 and 3.

FIG. 7 is a diagram showing impurity distributions of boron when the boron ion implantation energy is changed. An impurity distribution in the N-wells 2 and 3 is shown together with the impurity distribution of boron, when phosphor is ion-implanted in a dose quantity of $12E3/cm^2$ in the ion implantation energy of 360 keV to form the N-wells 2 and 3. The impurity distributions were measured by a secondary ion mass analysis (SIMS).

From the impurity distributions, it could be understood that a boron concentration peak when the boron ion implantation energy is 300 keV is positioned deeper than the phosphor concentration peak of the N-well by about 0.3 micrometers. Also, it could be understood that a boron concentration peak when the boron ion implantation energy is 500 keV is positioned deeper than the phosphor concentration peak of the N-well by about 0.8 micrometers. Therefore, a sufficient effect of punchthrough prevention is achieved in the structure of the P-well 4, in which the boron concentration peak is located positioned deeper than the phosphor concentration peak of the N-wells 2 and 3 by about 0.3 to 0.8 micrometers.

Next, a relation of the distance between the N-wells 2 and 3 and the boron peak concentration is discussed to prevent a punchthrough between the N-wells 2 and 3. It could be understood from FIG. 7 that the boron concentration peak are approximately the same in case of the dose quantity of boron of $1E12/cm^2$ and the ion implantation energy of 300 keV and the boron concentration peak in case of the dose quantity of $1E12/cm^2$ and the ion implantation energy of 500 keV.

Figure 8:
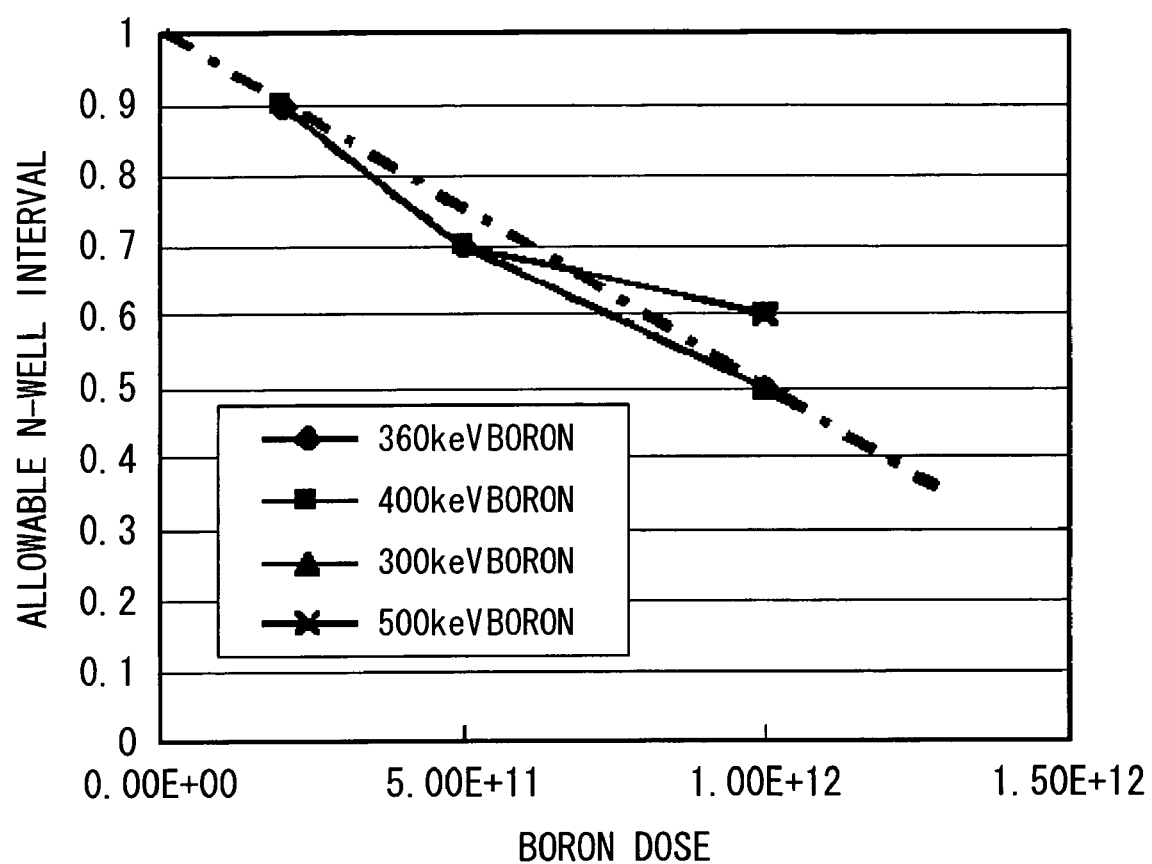
FIG. 8 is a graph showing a minimum necessary interval between the N-well 2 and 3 when the dose quantity of boron is changed by changing an ion implantation energy in a range of 300 to 500 keV.

FIG. 8 is a plot showing the minimum necessary interval between the N-wells 2 and 3 when the ion implantation energy is varied in a range of 300 to 500 keV. Here, the minimum necessary interval between the N-wells 2 and 3 is defined as the interval in which the punchthrough does not occur even if the voltage of 20 V is applied to the N-well 3 under the above-mentioned bias condition.

When the relation of the minimum necessary interval is in micrometers, between the N-wells 2 and 3, the boron peak concentration is approximated by a straight line of the following equation on the logarithm coordinate as show in FIG. 8 by a broken line, np=(1−s)*1.4E16 (atom/cm$^3$).

Next, the second embodiment of the present invention will be described with reference to the attached drawings. This embodiment differs from the first embodiment in the structure of the P-well and is the same as the first embodiment in the other structure.

Figure 9:
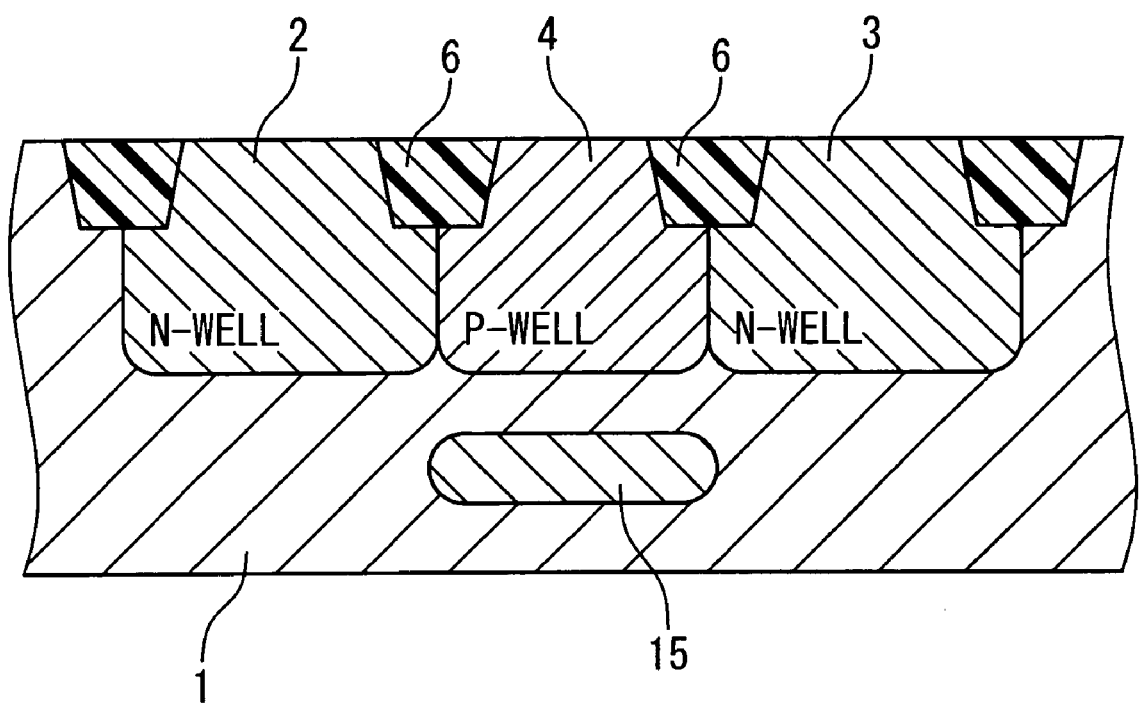
FIG. 9 is a schematic cross sectional view showing the semiconductor device of a second embodiment of the present invention.

As shown in FIG. 9, two N-wells 2 and 3 are provided for the P-type semiconductor substrate 1 and the P-well 4 is put between them. A P-well 15 is provided below the P-well 4 to cover the P-well 4 fully in a plane. For example, trench separation insulating films 6 are provided between the two N-wells 2 and 3 and the P-well 4, and between in the neighborhood of the N-wells 2 and 3 on the opposite side to the P-well 4.

Figure 10:
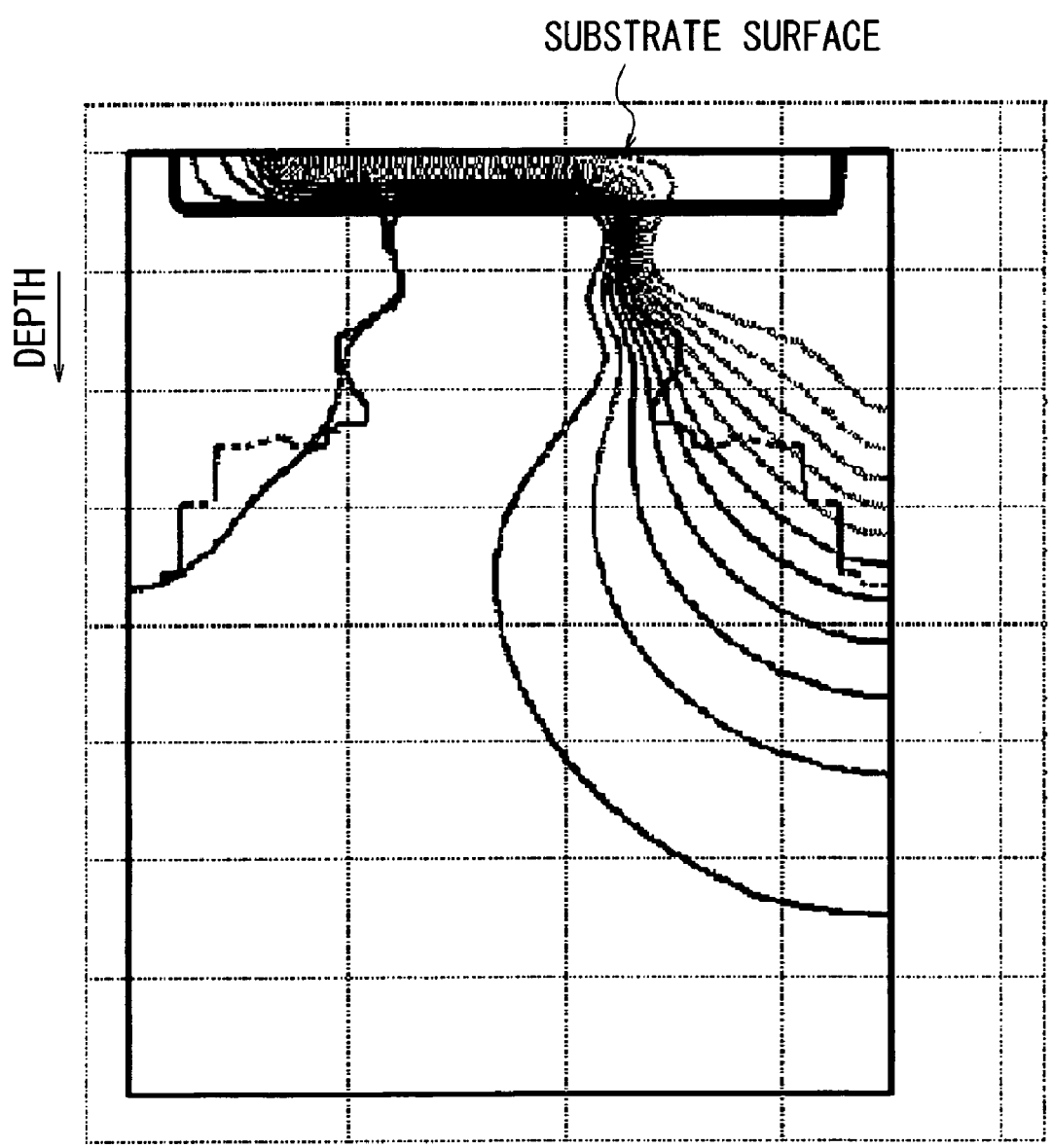
FIG. 10 is a diagram showing a potential distribution when a voltage is applied to one of the two N-wells in the semiconductor device of the second embodiment of the present invention.

In the above structure, a potential distribution is obtained as shown in FIG. 10 when the P-type semiconductor substrate 1, the N-well 2 and P-well 4 are grounded and the voltage of 10 V is applied to the N-well 3. Comparing the potential distribution of FIG. 10 and the potential distribution of FIG. 3 in which the P-well 15 is not provided, the 10-V potential line of FIG. 3 extends downwardly and in the lateral direction to the N-well 2, although a 10-V potential line of FIG. 10 is situated between the N-wells 2 and 3 into the lateral direction. It could be understood from this that that the extension of the depletion layer from the N-well 3 into the lateral direction is suppressed and the punchthrough can be prevented in the structure of FIG. 9.

Therefore, as understood from the embodiments, if the P-well 15 is provided below the P-well 4 to cover the P-well 4 in a plane at least, the punchthrough between the N-wells 2 and 3 can be prevented.

In the above description, when the P-type epitaxial layer should be provided below the two N-wells and the P-well between them, the P-type epitaxial layer is desirably formed to have the same concentration as that of the above-mentioned well 5 and the same depth as the P-well 5 in the P-type semiconductor substrate.

Also, the present invention is described about the structure in which the two N-wells are provided for the P-type semiconductor substrate, the P-well is provided between them and the embedded P-well is provided below them. However, the punchthrough between the wells can be prevented and the size reduction of the semiconductor integrated circuit becomes possible by carrying out a similar pattern design and a process design, even in a semiconductor device having the structure of the wells of conductive types opposite to the above conductive types, although the optimal values are different from those described in the embodiments of the present invention.

As described above, according to the present invention, by providing the two N-wells for the P-type semiconductor substrate, the P-well between them and the embedded P-well below them, the punchthrough between the wells can be prevented and the interval between the N-wells can be made short.

What is claimed is:

1. A semiconductor device comprising:
a semiconductor region of a first conductive type;
first and second regions of a second conductive type opposite to the first conductive type, wherein said first and second regions are provided in a surface of said semiconductor region in a predetermined interval;
a third region of said first conductive type which is provided between said first and second regions in said surface of said semiconductor region; and
a fourth region of said first conductive type which is provided below said third region inside said semiconductor region to cover the whole of bottom of said third region at least;
wherein a position of an impurity peak concentration of said fourth region into a depth direction is deeper than a peak position of an impurity concentration in each of said first and second regions into the depth direction;
wherein a minimum of an impurity peak concentration of said fourth region is (1−s)*1.4E16 (atom/cm$^3$), where said predetermined interval is a ($\mu$m).

2. A semiconductor device comprising:
a semiconductor region of a first conductive type;
first and second regions of a second conductive type opposite to the first conductive type, wherein said first and second regions are provided in a surface of said semiconductor region in a predetermined interval;
a third region of said first conductive type which is provided between said first and second regions in said surface of said semiconductor region; and
a fourth region of said first conductive type which is provided below said third region inside said semiconductor region to cover the whole of bottom of said third region at least;
wherein a position of an impurity peak concentration of said fourth region into a depth direction is deeper than a peak position of an impurity concentration in each of said first and second regions into the depth direction;
wherein the position of the impurity peak concentration in the fourth region into the depth direction is deeper in a range of 0.3 to 0.8 $\mu$m than that of the impurity peak concentration in each of said first and second regions.

3. The semiconductor device according to claim 2, wherein a minimum of said impurity peak concentration of said fourth region is (1−s)*1.4E16 (atom/cm$^3$), where said predetermined interval is s ($\mu$m).

4. A semiconductor device comprising:
a semiconductor region of a first conductive type;
first and second regions of a second conductive type opposite to the first conductive type, wherein said first and second regions are provided in a surface of said semiconductor region in a predetermined interval;
a third region of said first conductive type which is provided between said first and second regions in said surface of said semiconductor region; and
a fourth region of said first conductive type which is provided below said third region inside said semiconductor region to cover the whole of bottom of said third region at least;
wherein a position of an impurity peak concentration of said fourth region into a depth direction is deeper than a peak position of an impurity concentration in each of said first and second regions into the depth direction;
wherein said impurity peak concentration of said fourth region becomes higher as said predetermined interval becomes narrower.

5. A semiconductor device comprising:
a semiconductor region of a first conductive type;
first and second regions of a second conductive type opposite to the first conductive type, wherein said first and second regions are provided in a surface of said semiconductor region in a predetermined interval;

a third region of said first conductive type which is provided between said first and second regions in said surface of said semiconductor region; and a fourth region of said first conductive type which is provided below said first to third regions inside said semiconductor region to cover the whole bottoms of said first to third regions;

wherein a position of an impurity peak concentration of said fourth region into a depth direction is deeper than a peak position of an impurity concentration in each of said first and second regions into the depth direction;

wherein the position of the impurity peak concentration in the fourth region into the depth direction is deeper in a range of 0.3 to 0.8 µm than that of the impurity peak concentration in each of said first and second regions.

6. The semiconductor device according to claim 5, wherein a minimum of said impurity peak concentration of said fourth region is $(1-s)*1.4E16$ (atom/cm$^3$), where said predetermined interval is s (µm).

7. A semiconductor device comprising:

a semiconductor region of a first conductive type;

first and second regions of a second conductive type opposite to the first conductive type, wherein said first and second regions are provided in a surface of said semiconductor region in a predetermined interval;

a third region of said first conductive type which is provided between said first and second regions in said surface of said semiconductor region; and a fourth region of said first conductive type which is provided below said first to third regions inside said semiconductor region to cover the whole bottoms of said first to third regions;

wherein a position of an impurity peak concentration of said fourth region into a depth direction is deeper than a peak position of an impurity concentration in each of said first and second regions into the depth direction wherein a minimum of said impurity peak concentration of said fourth region is $(1-s)*1.4E16$ (atom/cm$^3$), where said predetermined interval is s (µm).

8. A semiconductor device comprising:

a semiconductor region of a first conductive type;

first and second regions of a second conductive type opposite tote first conductive type, wherein said first and second regions are provided in a surface of said semiconductor region in a predetermined interval;

a third region of said first conductive type which is provided between said first and second regions in said surface of said semiconductor region; and a fourth region of said first conductive type which is provided below said first to third regions inside said semiconductor region to cover the whole bottoms of said first to third regions;

wherein a position of an impurity peak concentration of said fourth region into a depth direction is deeper than a peak position of an impurity concentration in each of said first and second regions into the depth direction;

wherein said impurity peak concentration of said fourth region becomes higher as said predetermined interval becomes narrower.

9. A semiconductor device comprising:

a semiconductor region of a first conductive type;

first and second regions of a second conductive type opposite to the first conductive type, wherein said first and second regions are provided in a surface of said semiconductor region in a predetermined interval;

a third region of said first conductive type which is provided between said first and second regions in said surface of said semiconductor region;

a fourth region of said first conductive type which is provided below said third region inside said semiconductor region to cover the whole of bottom of said third region at least;

a first isolation film provided between said first region and said third region; and a second isolation film provide between said second region and said third region.

10. The semiconductor device according to claim 9, wherein said fourth region is provided to be separated away from said third region.

11. The semiconductor device according to claim 10, wherein said fourth region is provided to be separated away from said first and second regions.

* * * * *

UNITED STATES PATENT AND TRADEMARK OFFICE
CERTIFICATE OF CORRECTION

PATENT NO. : 6,679,845 B2 Page 1 of 1
DATED : December 27, 2005
INVENTOR(S) : Kawaguchi et al.

It is certified that error appears in the above-identified patent and that said Letters Patent is hereby corrected as shown below:

Column 8,
Line 33, "provide" should be -- provided --.

Signed and Sealed this

Fourth Day of April, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,979,845 B2 |
| APPLICATION NO. | : 10/763551 |
| DATED | : December 27, 2005 |
| INVENTOR(S) | : Hiroshi Kawaguchi et al. |

It is certified that error appears in the above-identified patent and that said Letters Patent is hereby corrected as shown below:

This certificate supersedes the certificate of correction issued on April 4, 2006 that contained a typographical error in the patent number. The patent number was incorrectly listed as 6679845 in the heading of the issued cofc. The corrections in the April 4, 2006 Certificate of Correction that belonged to Patent No. 6979845 are as follows:

Column 8,
Line 33, "provide" should be --provided--.

Signed and Sealed this

Tenth Day of April, 2007

JON W. DUDAS
*Director of the United States Patent and Trademark Office*